(12) United States Patent
Brasz et al.

(10) Patent No.: US 7,289,325 B2
(45) Date of Patent: Oct. 30, 2007

(54) POWER CONVERTER COOLING

(75) Inventors: Joost J. Brasz, Fayetteville, NY (US); Bruce P. Biederman, West Hartford, CT (US)

(73) Assignee: UTC Power Corporation, South Windsor, CT (US)

( * ) Notice: Subject to any disclaimer, the term of this patent is extended or adjusted under 35 U.S.C. 154(b) by 128 days.

(21) Appl. No.: 11/254,153

(22) Filed: Oct. 19, 2005

(65) Prior Publication Data

US 2006/0034054 A1 Feb. 16, 2006

Related U.S. Application Data

(62) Division of application No. 10/463,045, filed on Jun. 17, 2003, now Pat. No. 6,989,989.

(51) Int. Cl.
*H05K 7/20* (2006.01)
*H02M 1/10* (2006.01)
*H02J 3/00* (2006.01)

(52) U.S. Cl. .................. 361/699; 361/702; 363/141

(58) Field of Classification Search .............. 363/34, 363/37, 141; 361/688, 690–693, 698, 699, 361/701, 702, 707, 709, 711; 62/259.2, 263
See application file for complete search history.

(56) References Cited

U.S. PATENT DOCUMENTS

| 4,386,499 A | 6/1983 | Raviv et al. |
| 4,590,384 A | 5/1986 | Bronicki |
| 4,617,808 A | 10/1986 | Edwards |
| 4,760,705 A | 8/1988 | Yogev et al. |
| 4,901,531 A | 2/1990 | Kubo et al. |
| 5,038,567 A | 8/1991 | Mortiz |
| 5,119,635 A | 6/1992 | Harel |
| 5,339,632 A | 8/1994 | McCrabb et al. |
| 5,598,706 A | 2/1997 | Bronicki et al. |
| 5,632,143 A | 5/1997 | Fisher et al. |
| 5,640,842 A | 6/1997 | Bronicki |
| 5,664,419 A | 9/1997 | Kaplan |
| 5,761,921 A | 6/1998 | Hori et al. |

(Continued)

FOREIGN PATENT DOCUMENTS

DE 19630559 1/1998

(Continued)

OTHER PUBLICATIONS

Thermodynamics of Waste Heat Recovery in Motor Ships, Professor A.J. Morton, MSc, Manchester University, Mechanical Engineering Dept., Trans I Mar E (C), 1981, vol. 93, Paper C69, pp. 1-7.

*Primary Examiner*—Matthew V. Nguyen
(74) *Attorney, Agent, or Firm*—Marjama Muldoon Blasiak & Sullivan LLP

(57) ABSTRACT

A power conversion system which uses a plurality of transistors to convert DC power to AC power is made more efficient by the use of liquid refrigerant to cool the transistors. A plurality of passages are formed in a cold plate on which the transistors are mounted, and liquid refrigerant is flashed into the passages to cool the cold plate and the transistors. The liquid refrigerant can by derived from a condenser from an organic rankine cycle or a vapor compression cycle.

7 Claims, 4 Drawing Sheets

U.S. PATENT DOCUMENTS

| | | | |
|---|---|---|---|
| 5,809,782 A | 9/1998 | Bronicki et al. | |
| 5,860,279 A | 1/1999 | Bronicki et al. | |
| 6,009,711 A | 1/2000 | Kreiger et al. | |
| 6,101,813 A | 8/2000 | Sami et al. | |
| 6,313,991 B1 * | 11/2001 | Nagashima et al. | 361/699 |
| 6,497,090 B2 | 12/2002 | Bronicki et al. | |
| 6,539,718 B2 | 4/2003 | Bronicki et al. | |
| 6,539,720 B2 | 4/2003 | Rouse et al. | |
| 6,539,723 B2 | 4/2003 | Bronicki et al. | |
| 6,571,548 B1 | 6/2003 | Bronicki et al. | |
| 6,595,024 B1 * | 7/2003 | Tang et al. | 62/498 |
| 6,892,522 B2 * | 5/2005 | Brasz et al. | 60/39.181 |
| 7,068,507 B2 * | 6/2006 | Pfeifer et al. | 361/699 |
| 2002/0148225 A1 | 10/2002 | Lewis | |
| 2003/0029169 A1 | 2/2003 | Hanna et al. | |
| 2003/0089110 A1 | 5/2003 | Niikura et al. | |
| 2003/0167769 A1 | 9/2003 | Bharathan et al. | |

FOREIGN PATENT DOCUMENTS

| | | |
|---|---|---|
| DE | 19907512 | 8/2000 |
| DE | 10029732 | 1/2002 |
| EP | 1243758 | 9/2002 |
| JP | 52046244 | 4/1977 |
| JP | 54045419 | 4/1979 |
| JP | 54060634 | 5/1979 |
| JP | 55091711 | 7/1980 |
| JP | 58088409 | 5/1983 |
| JP | 58122308 | 7/1983 |
| JP | 59043928 | 3/1984 |
| JP | 59054712 | 3/1984 |
| JP | 59063310 | 4/1984 |
| JP | 59138707 | 8/1984 |
| JP | 59158303 | 9/1984 |
| JP | 60158561 | 8/1985 |
| JP | 06088523 | 3/1994 |
| JP | 2002266655 | 9/2002 |
| JP | 2002285805 | 10/2002 |
| JP | 2002285907 | 10/2002 |
| JP | 2003161101 | 6/2003 |
| JP | 2003161114 | 6/2003 |
| WO | WO98/06791 | 2/1998 |
| WO | WO 02/099279 | 12/2002 |
| WO | WO 03/078800 | 9/2003 |

* cited by examiner

POWER CONVERTER COOLING

CROSS REFERENCE TO RELATED APPLICATIONS

This application is a divisional of Ser. No. 10/463,045, filed Jun. 17, 2003 now U.S. Pat. No. 6,989,989 which is incorporated herein by reference.

BACKGROUND OF THE INVENTION

This invention relates generally to power conversion systems and, more particularly, to a method and apparatus for cooling power converters.

In the power generation industry, high speed generators are used to generate electrical power at relatively high frequencies (typically a number of times higher than the grid frequency), and power converters are used to convert the high frequency AC power down to an AC grid frequency of 50 or 60 Hz. This is accomplished by rectifying the high frequency AC signal and then generating a new sinusoidal AC wave of the desired frequency. The creation of the new wave involves the use of integrated gate bipolar transistors (IGBT's), which are switched at a carrier frequency rate, which is an order of magnitude higher than the power converter output frequency. Because of the necessary repeated on and off switching of the IGBT's, they generate a substantial amount of heat which must be dissipated. Without cooling this dissipated heat, the temperatures of solid state junctions in the IGBT's would exceed the maximum values, and the transformers would be permanently damaged. Accordingly, all high frequency power conversion equipment typically applies some type of cooling in order to control these junction temperatures.

The cooling requirement increases with power capacity in the IGBT's, and, at a given switching frequency, as the amount of current going through an IGBT is decreased, the heat that is developed will be decreased. Accordingly if the temperature of the solid state junction can be reduced, then the current being switched on and off through the junction can be increased to thereby enhance the power density of the power converter. Further, acceptable IGBT lifetime can be assured if the temperature of the solid state junction is kept below a certain maximum value.

Progress has been made in IGBT design to enable forced-convection air-cooled finned cold plates in removing the heat from the transistors. However, forced-convection air-cooling of finned cold plates is relatively ineffective due to the poor heat transfer between the cooling air and the finned cold plate.

It is therefore an object of the present invention to provide an improved cooling method and apparatus for a power converter.

Another object of the present invention is the provision in a power converter for more effectively cooling the transistors therein.

Another object of the present invention is the provision in a power converter for reducing the temperature of the solid state junctions while increasing the current flow therein.

Yet another object of the present invention is to improve the life of transistors in power conversion systems.

Still another object of the present invention is the provision for a power conversion system that is economical to manufacture and effective and efficient in use.

These objects and other features and advantages become more readily apparent upon reference to the following description when taken in conjunction with the appended drawings.

SUMMARY OF THE INVENTION

Briefly, in accordance with one aspect of the invention, liquid refrigerant is used to reduce the temperature of the transistors and increase the current flow therethrough.

In accordance with another aspect of the invention, liquid refrigerant is caused to flow through internal channels of a cold plate on which the insulated gate bipolar transistors are mounted. In this way, the heat from the transistors is more effectively dissipated such that the transistors can carry greater currents and operate more efficiently.

By yet another aspect of the invention, the liquid refrigerant is taken from the discharge of a pump in an organic rankine cycle system and is routed to a power converter receiving the output of a high frequency generator driven by the organic rankine cycle turbine.

By yet another aspect of the invention, the liquid refrigerant is taken from the discharge of a pump in an organic rankine cycle system and routed to a power converter receiving its electrical power from a generator driven by a microturbine.

By still another aspect of the invention, the liquid refrigerant is taken from the condenser of a conventional vapor compression cycle, and is allowed to expand into the cold plate, after which the resulting vapor is caused to flow back to the compressor of the vapor compression cycle.

In the drawings as hereinafter described, a preferred embodiment is depicted; however, various other modifications and alternate constructions can be made thereto without departing from the true spirit and scope of the invention.

DESCRIPTION OF THE PREFERRED EMBODIMENT

Figure 1:
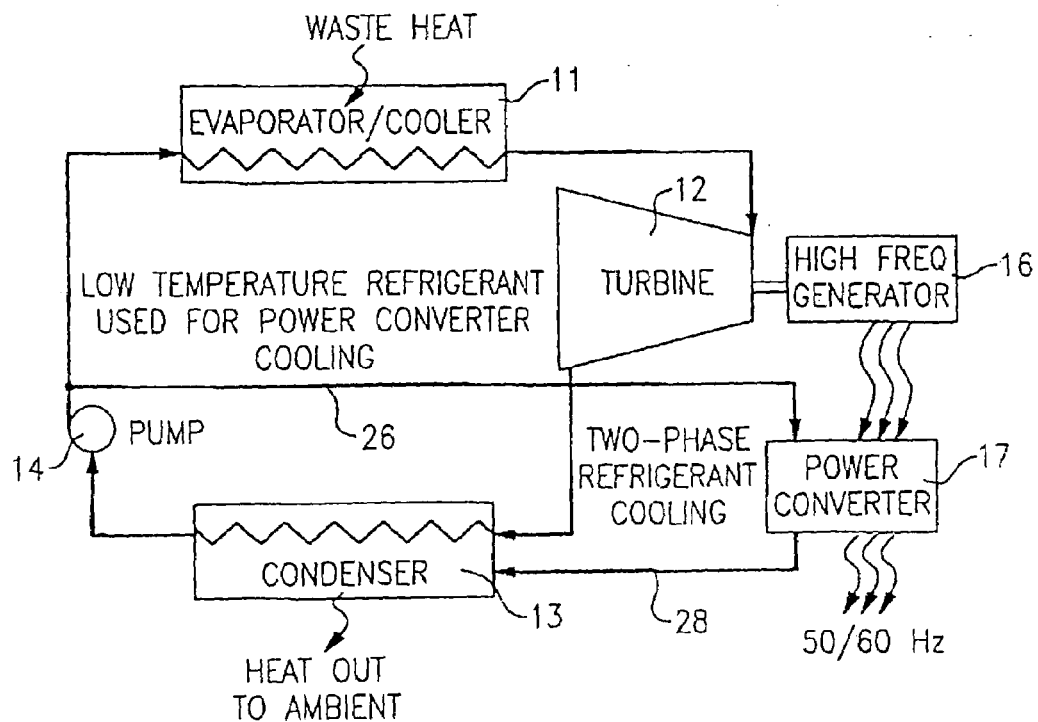
FIG. 1 is an organic rankine cycle power generation system in accordance with the present invention.

Referring now to FIG. 1, a rankine cycle system is shown to include an evaporator/cooler 11, a turbine 12, a condenser 13 and a pump 14 arranged for the serial flow of refrigerant therethrough as shown by the arrows.

The evaporator/cooler 11 is commonly a boiler having a significant heat input, and the energy source that is applied as waste heat can be of any form of waste heat that may normally be lost to the atmosphere. For example, it may be a small gas turbine engine (<500 kw), known as a microturbine or a larger industrial gas turbine engine (>500 Kw).

In either case, the heat is derived from the exhaust gas thereof. Other possible sources of waste heat are from the exhaust gases and/or cooling liquids from internal combustion engines. Finally, the energy may be derived from geothermal sources or from landfill flare exhausts wherein the hot fluids are applied directly to the boiler to produce refrigerant vapor or applied indirectly by first using those resource fluids to drive an engine which, in turn, gives off heat which can be used as described hereinabove.

In operation, the evaporator/cooler 11 vaporizes the refrigerant which then passes to the turbine 12 for providing motive power thereto. Upon leaving the turbine 12, the low pressure vapor passes through the condenser 13 where it is condensed by way of heat exchange relationship with a cooling medium. The cooled condensed liquid is then pressurized and circulated to the evaporator/boiler by a pump 14 to complete the cycle.

Drivingly connected to the turbine 12 is a high frequency generator 16. In order to be efficient, the turbine 12 must operate at high speeds, and preferable the generator 16 is connected in a direct drive relationship such that the generator 16 must also operate at relatively high speeds. As a result, and as desired for greatest efficiency, the power generated by the high frequency generator 16 is typically a number of times greater than the frequency of the grid (i.e. 50 or 60 Hz) that is to receive the generated power. It is therefore necessary to provide a power converter 17 to convert the high frequency power to a lower frequency power that can be applied directly to the grid.

Figure 2:
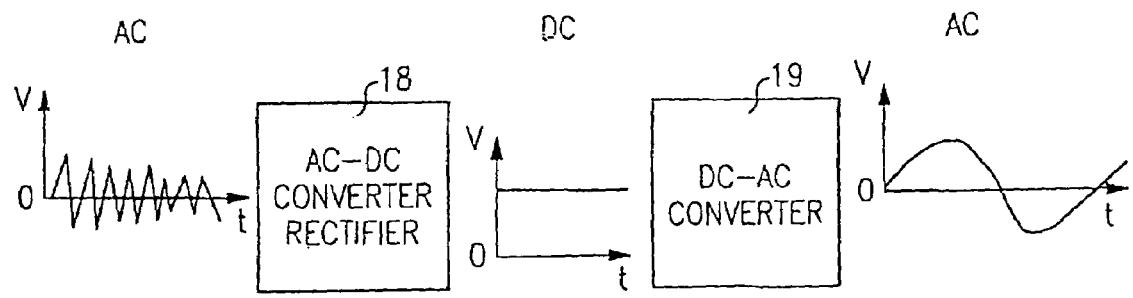
FIG. 2 is a schematic illustration of the function of a power converter in accordance with the prior art.

Referring to FIG. 2, there is shown a functional diagram of what occurs within the power converter 17. Briefly, the high frequency AC signal is passed through one or more rectifiers 18 that convert the power to DC, and then the DC signal is fed to an inverter 19 which generates the new sinusoidal AC wave of the desired low frequency.

Figure 3:
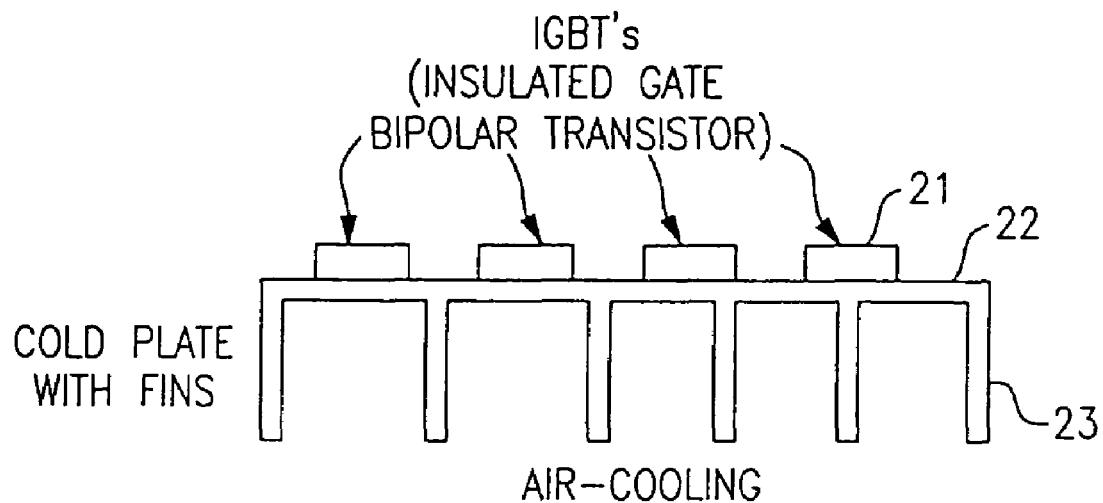
FIG. 3 is a schematic illustration of the cooling of a power converter in accordance with the prior art.
Figure 3:
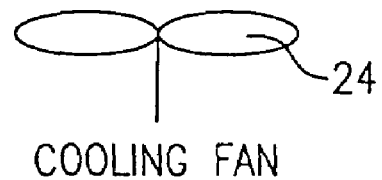

The inverter function is accomplished by the sequential operation of a great number of switching mechanisms commonly referred to as IGBT's (insulated heat bipolar transistors). Because of the required rapid switching operation, the IGBT's tend to generate a great deal of heat which, if not dissipated, will quickly burn out the transistors. It has therefore become conventional practice to mount the IGBT's 21 on a cold plate 22 having a plurality of cooling fins 23 as shown in FIG. 3. In order to dissipate the heat from the cold plate 22 a cooling fan 24 is directed to circulate cool air over the fin 23. Although effective, this approach has been recognized by the applicants as inadequate in providing the degree of cooling that is desirable in order to allow for the desired power densities in the power converter 17.

Figure 4:
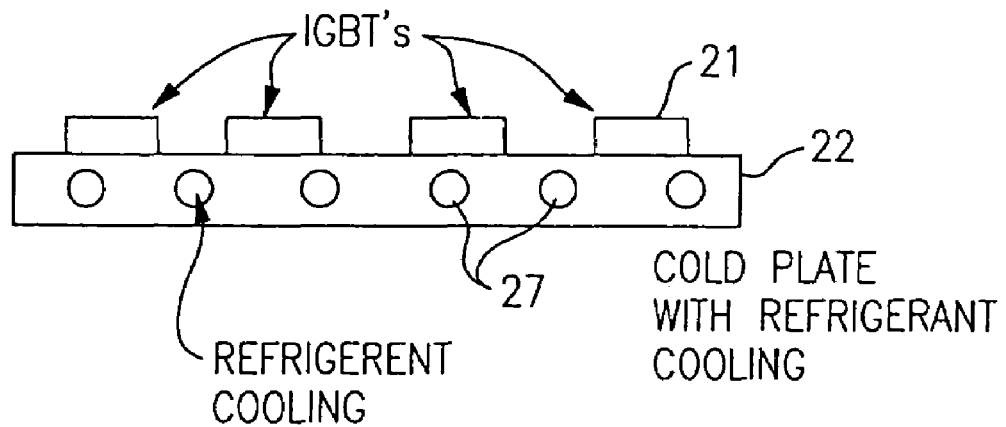
FIG. 4 is a schematic illustration of the cooling arrangement for a power converter in accordance with the present invention.

Referring again to FIG. 1, it will be seen that at the output of the pump 14 a relatively high pressure cold refrigerant is readily available and can be effectively used in the cooling of the power converter components. A line 26 is therefore provided to conduct a relatively small amount of cold, high pressure, liquid refrigerant to the power converter 17 where it is expanded into a plurality of internal openings 27 of the cold plate 22 as shown in FIG. 4. The flashing of the refrigerant into the cold plate 22 quickly and substantially reduces the temperature of the cold plate, which is in contact with the IGBT's 21, and reduces the IGBT solid state junction temperature dramatically, e.g. by 50 to 100° F. depending on the design. This, in turn, allows more current to be passed through the IGBT's, such that the power switching capacity of the solid state hardware increases substantially thereby increasing the power density by 50 to 100%, thus reducing the cost of power conversion equipment by the same percentage.

After the refrigerant passes through the cold plate 27 the resulting refrigerant vapor is passed along through the condenser 13 by way of line 28 as shown in FIG. 1.

Figure 5:
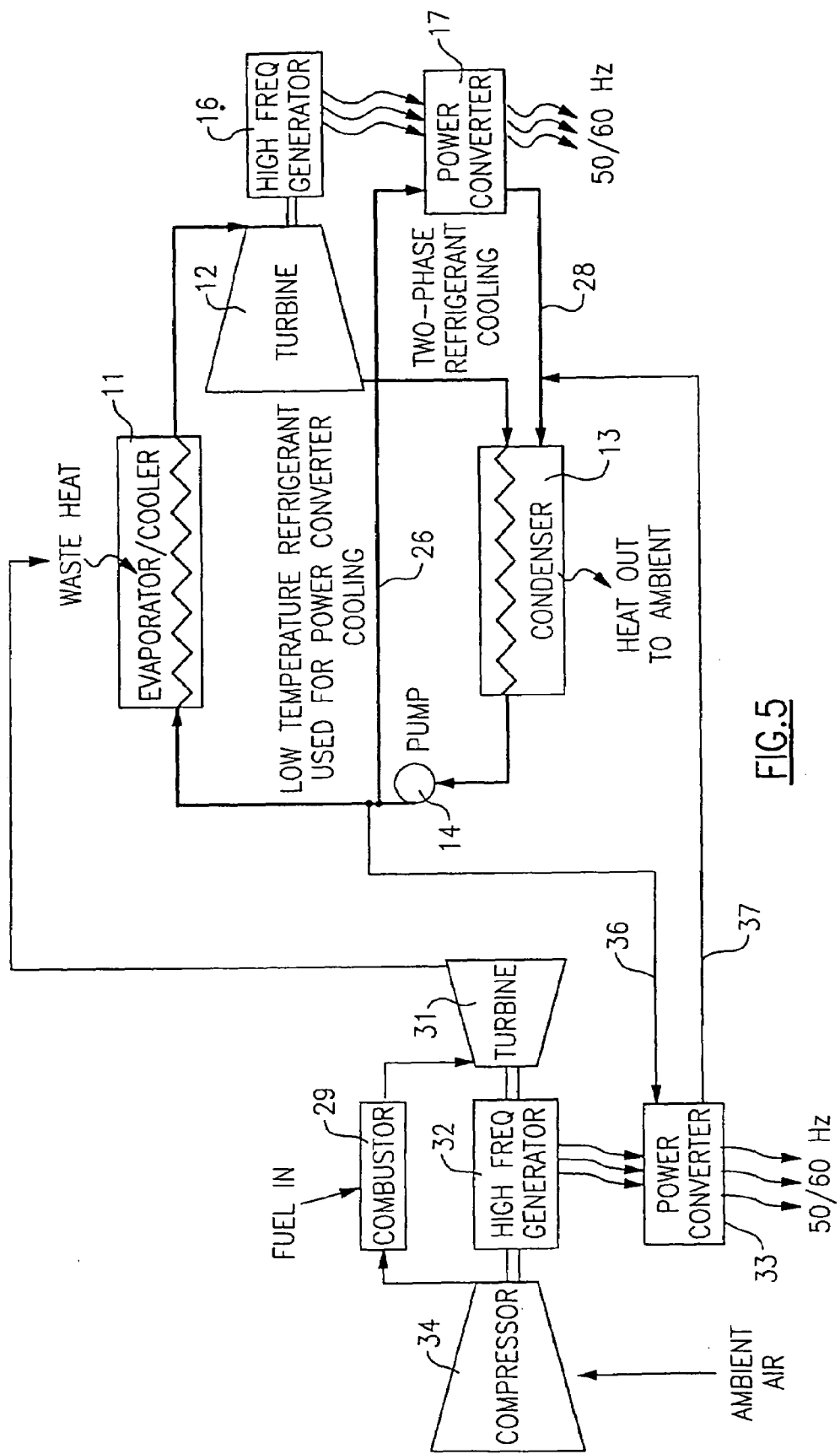
FIG. 5 is a schematic illustration of the cooling of a power converter in a microturbine system in accordance with the present invention.

Referring now to FIG. 5, another embodiment of the present invention is shown to include not only the organic rankine cycle system as described hereinabove, but also a microturbine that can be used in combination with the organic rankine cycle system. For example, the microturbine may burn natural gas or landfill methane gas in its combustion chamber, and with use of the turbine, convert that energy into electrical energy which may be transferred to the grid. In turn, the exhaust from the microturbine may be used to heat the boiler 11 of the organic rankine cycle system.

The microturbine system as shown in the left side of FIG. 5 includes a burner or combuster 29, a turbine 31, and a generator 32 which operate in much the same manner as the turbine and the generator in the organic rankine cycle system as described hereinabove. Further, the power generated by the generator 32 is typically of the high frequency type as described hereinabove such that it is necessary to pass it through a power converter 33 to convert the power to a lower frequency form that can be assimilated into the grid.

The gas turbine requires compression of ambient air and fuel (e.g. natural gas or methane) prior to ignition in the burner 29. This is accomplished by a compressor 34 which is driven by the shaft that is common to the generator 32 and the turbine 31.

The power converter 33 is of the same type as the power converter 17, and the cooling arrangement as shown in FIG. 4 is substantially the same, with liquid refrigerant passing along line 36 to the cold plate of the power converter 33, and the refrigerant vapor then passing back to the condenser 15 by way of line 37.

Figure 6:
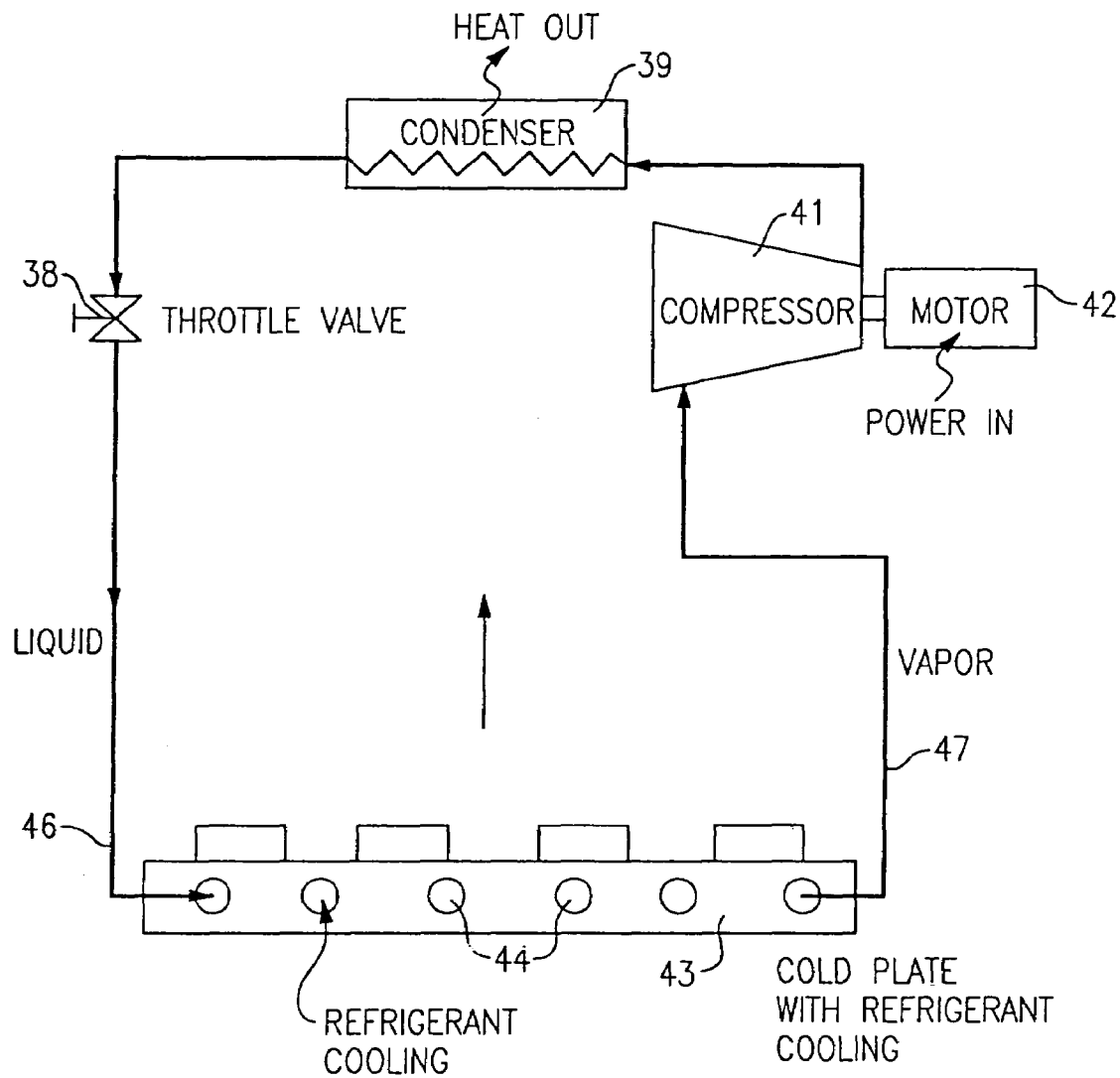
FIG. 6 is a schematic illustration of the cooling of a power converter with a conventional vapor compression cycle in accordance with the present invention.

So far the present invention has been described in terms of use of liquid refrigerant from an organic rankine cycle system, that is diverted to a power converter for cooling the components therein. However, it should be recognized that this source of liquid refrigerant can come from other types of apparatus such as that as shown in FIG. 6. Here, a rather conventional vapor compression system is shown to include a throttle valve 38, a condenser 39 and a compressor 41 driven by a motor 42. However, rather than an evaporator that is part of a conventional vapor compression system, the cold plate 43 of a power converter, having openings 44 for the flow of refrigerant is connected in as part of the cycle. Thus, liquid refrigerant flows along lines 46 from the throttle valve 38 to the cold plate 43 where it is expanded to cool the cold plate 43. The resulting refrigerant vapor then flows from the cold plate 43, along lines 47 to the compressor 41.

The cooling requirement of a power converter is around 3% of the power being converted. A typical air cooled air conditioning device having a coefficient of performance of around 3, will therefore need only 1% of the power generated to perform the cooling thus doubling the power density or capacity of the power converter.

The vapor compression system as shown in FIG. 6 is a relatively small system on the order of a room air conditioner for a 200 kw microturbine, and can be easily and economically adapted for use to cool a power converter and in doing so will substantially increase its power capacity so as to being about substantial economic gains.

While the present invention has been particularly shown and described with reference to preferred and alternate embodiments as illustrated in the drawings, it will be understood by one skilled in the art that various changes and detail may be effected therein without departing from the true sprit and scope of the invention as defined by the claims.

We claim:

1. A method of improving the performance of a power converter of the type having an inverter for converting direct current to an alternating current by way of a plurality of switches, comprising the step of:
   providing a cold plate;
   mounting a plurality of transistors on said cold plate in heat exchange relationship therewith;
   deriving a flow of liquid refrigerant from a condenser in a closed circuit system; and
   introducing said flow of liquid refrigerant in the vicinity of said cold plate and allowing it to flash to a vapor while cooling said cold plate and said plurality of switches.

2. A method as set forth in claim 1 wherein said plurality of switches comprise transistors.

3. A method as set forth in claim 2 wherein said transistors are of the insulated gate bipolar transistor type.

4. A method as set forth in claim 1 and including the step of forming a plurality of passages in said cold plate.

5. A method as set forth in claim 4 wherein said step of introducing a flow of liquid refrigerant in the vicinity of said cold plate comprises the step of causing the liquid refrigerant to flow through said passages.

6. A method as set forth in claim 1 wherein said closed circuit system is a vapor compression system.

7. A method as set forth in claim 1 wherein said closed circuit system is an organic rankine cycle system.

* * * * *